United States Patent
Wildeson et al.

(10) Patent No.: US 12,419,137 B2
(45) Date of Patent: Sep. 16, 2025

(54) LIGHT EMITTING DIODES WITH SEGMENTED ANODES BY PIXEL

(71) Applicant: Lumileds LLC, San Jose, CA (US)

(72) Inventors: Isaac Wildeson, Nashua, NH (US); Hossein Lotfi, Folsom, CA (US); Ronald Bonne, Plainfield, IL (US); Toni Lopez, Vaals (NL)

(73) Assignee: Lumileds LLC, San Jose, CA (US)

( * ) Notice: Subject to any disclaimer, the term of this patent is extended or adjusted under 35 U.S.C. 154(b) by 487 days.

(21) Appl. No.: 17/898,971

(22) Filed: Aug. 30, 2022

(65) Prior Publication Data
US 2023/0126041 A1     Apr. 27, 2023

Related U.S. Application Data

(60) Provisional application No. 63/242,831, filed on Sep. 10, 2021.

(51) Int. Cl.
| | | |
|---|---|---|
| *H10H 20/01* | (2025.01) | |
| *H01L 25/075* | (2006.01) | |
| *H10H 20/831* | (2025.01) | |
| *H10H 20/857* | (2025.01) | |
| *H10H 29/14* | (2025.01) | |

(52) U.S. Cl.
CPC ......... *H10H 20/01* (2025.01); *H01L 25/0753* (2013.01); *H10H 20/857* (2025.01); *H10H 20/0364* (2025.01)

(58) Field of Classification Search
CPC .. H10H 20/8314; H10H 20/84; H10H 20/032; H10H 20/8316
See application file for complete search history.

(56) References Cited

U.S. PATENT DOCUMENTS

| | | |
|---|---|---|
| 6,410,942 B1 | 6/2002 | Thibeault et al. |
| 6,657,236 B1 | 12/2003 | Thibeault et al. |
| 6,821,804 B2 | 11/2004 | Thibeault et al. |
| 8,222,811 B2 | 7/2012 | Vaufrey et al. |
| 8,258,044 B2 | 9/2012 | Brun et al. |

(Continued)

FOREIGN PATENT DOCUMENTS

| | | |
|---|---|---|
| DE | 102010051286 A1 | 5/2012 |
| DE | 102012109460 A1 | 4/2014 |

(Continued)

OTHER PUBLICATIONS

PCT International Search Report and Written Opinion in PCT/US2022/042127 dated Dec. 22, 2022, 8 pages.

*Primary Examiner* — Antonio B Crite
(74) *Attorney, Agent, or Firm* — Servilla Whitney LLC

(57) ABSTRACT

A light emitting diode (LED) device comprises a plurality of pixels on a backplane, each pixel comprising: semiconductor layers, which include an N-type layer, an active region, and a P-type layer; a cathode electrically contacting the N-type layer; an anode comprising anode segments electrically contacting respective portions of the P-type layer; one or more dielectric materials insulating: the active region and the P-type layer from the cathode, the anode segments from each other, and the anode segments from the cathode; and a plurality of interconnects, each respective interconnect affixing a respective anode segment to the backplane. Methods of making and use the devices are also provided.

20 Claims, 8 Drawing Sheets

(56) References Cited

U.S. PATENT DOCUMENTS

| | | |
|---|---|---|
| 8,487,340 B2 | 7/2013 | Gilet et al. |
| 8,638,032 B2 | 1/2014 | Maindron et al. |
| 8,647,957 B2 | 2/2014 | Borowik et al. |
| 8,697,548 B2 | 4/2014 | Borowik et al. |
| 8,698,396 B2 | 4/2014 | Maindron et al. |
| 8,890,111 B2 | 11/2014 | Templier et al. |
| 9,093,607 B2 | 7/2015 | Gilet et al. |
| 9,109,296 B2 | 8/2015 | Metaye et al. |
| 9,112,112 B2 | 8/2015 | Do et al. |
| 9,192,290 B2 | 11/2015 | Spinnler et al. |
| 9,209,366 B2 | 12/2015 | Maindron et al. |
| 9,263,633 B2 | 2/2016 | Gilet et al. |
| 9,396,970 B2 | 7/2016 | Gillot et al. |
| 9,422,628 B2 | 8/2016 | Simonato et al. |
| 9,496,465 B2 | 11/2016 | Sugimoto et al. |
| 9,507,204 B2 | 11/2016 | Pelka et al. |
| 9,601,542 B2 | 3/2017 | Robin et al. |
| 9,722,160 B2 | 8/2017 | Nakabayashi |
| 9,768,350 B2 | 9/2017 | Bavencove et al. |
| 9,887,184 B2 | 2/2018 | Takeya et al. |
| 9,945,526 B2 | 4/2018 | Singer et al. |
| 9,978,727 B2 | 5/2018 | Takeya et al. |
| 9,997,688 B2 | 6/2018 | Takeya et al. |
| 10,002,928 B1 | 6/2018 | Raring et al. |
| 10,018,325 B2 | 7/2018 | Kim et al. |
| 10,050,026 B2 | 8/2018 | Takeya et al. |
| 10,068,884 B2 | 9/2018 | Takeya et al. |
| 10,145,518 B2 | 12/2018 | Do et al. |
| 10,964,845 B2 | 3/2021 | Dimitropoulos et al. |
| 2011/0151607 A1 | 6/2011 | Landis et al. |
| 2011/0287606 A1 | 11/2011 | Brun et al. |
| 2012/0205614 A1 | 8/2012 | Templier et al. |
| 2013/0020115 A1 | 1/2013 | Mataye et al. |
| 2013/0112945 A1 | 5/2013 | Gilet et al. |
| 2014/0077156 A1 | 3/2014 | Bavencove et al. |
| 2014/0094878 A1 | 4/2014 | Gossler et al. |
| 2014/0138719 A1 | 5/2014 | Maindron et al. |
| 2015/0118544 A1 | 4/2015 | Oukassi |
| 2015/0144590 A1 | 5/2015 | Simonato et al. |
| 2015/0228873 A1 | 8/2015 | Gebuhr et al. |
| 2015/0280060 A1 | 10/2015 | Gilet et al. |
| 2015/0340346 A1 | 11/2015 | Chu et al. |
| 2015/0362165 A1 | 12/2015 | Chu et al. |
| 2015/0380461 A1 | 12/2015 | Robin et al. |
| 2016/0079565 A1 | 3/2016 | Maindron et al. |
| 2016/0093665 A1 | 3/2016 | Schubert et al. |
| 2016/0190400 A1 | 6/2016 | Jung et al. |
| 2016/0218240 A1 | 7/2016 | Bouvier et al. |
| 2016/0293811 A1 | 10/2016 | Hussell et al. |
| 2017/0080457 A1 | 3/2017 | Eymery et al. |
| 2017/0098746 A1 | 4/2017 | Bergmann et al. |
| 2017/0137645 A1 | 5/2017 | Manceau et al. |
| 2017/0186612 A1 | 6/2017 | Almadori et al. |
| 2017/0243860 A1 | 8/2017 | Hong et al. |
| 2017/0293065 A1 | 10/2017 | Kim |
| 2017/0358563 A1 | 12/2017 | Cho et al. |
| 2017/0358724 A1 | 12/2017 | Shichijo et al. |
| 2018/0017939 A1 | 1/2018 | Allier et al. |
| 2018/0019369 A1 | 1/2018 | Cho et al. |
| 2018/0019373 A1 | 1/2018 | Lehnhardt et al. |
| 2018/0061316 A1 | 3/2018 | Shin et al. |
| 2018/0074372 A1 | 3/2018 | Takeya et al. |
| 2018/0090540 A1 | 3/2018 | Von Malm et al. |
| 2018/0138157 A1 | 5/2018 | Im et al. |
| 2018/0145059 A1 | 5/2018 | Welch et al. |
| 2018/0149328 A1 | 5/2018 | Cho et al. |
| 2018/0156406 A1 | 6/2018 | Feil et al. |
| 2018/0166470 A1 | 6/2018 | Chae |
| 2018/0174519 A1 | 6/2018 | Kim et al. |
| 2018/0174931 A1 | 6/2018 | Henley |
| 2018/0210282 A1 | 7/2018 | Song et al. |
| 2018/0238511 A1 | 8/2018 | Hartmann et al. |
| 2018/0259137 A1 | 9/2018 | Lee et al. |
| 2018/0259570 A1 | 9/2018 | Henley |
| 2018/0272605 A1 | 9/2018 | Gmeinsieser et al. |
| 2018/0283642 A1 | 10/2018 | Liao et al. |
| 2018/0297510 A1 | 10/2018 | Fiederling et al. |
| 2018/0339643 A1 | 11/2018 | Kim |
| 2018/0339644 A1 | 11/2018 | Kim |
| 2018/0354406 A1 | 12/2018 | Park |
| 2019/0088820 A1 | 3/2019 | Danesh et al. |
| 2019/0157512 A1* | 5/2019 | Jung .................... H01L 25/167 |
| 2019/0319015 A1 | 10/2019 | Schuele et al. |
| 2020/0052151 A1 | 2/2020 | Kang et al. |
| 2020/0259055 A1 | 8/2020 | Iguchi et al. |
| 2020/0381588 A1 | 12/2020 | Thompson et al. |
| 2021/0118857 A1 | 4/2021 | Chi |

FOREIGN PATENT DOCUMENTS

| | | |
|---|---|---|
| DE | 102014112551 A1 | 3/2016 |
| EP | 1378949 A1 | 1/2004 |
| EP | 2027608 A1 | 2/2009 |
| EP | 2203939 A1 | 7/2010 |
| EP | 2211387 A2 | 7/2010 |
| EP | 2339658 A2 | 6/2011 |
| EP | 2491591 A1 | 8/2012 |
| EP | 2499958 A1 | 9/2012 |
| EP | 2521161 A1 | 11/2012 |
| EP | 2521162 A1 | 11/2012 |
| EP | 2553149 A1 | 2/2013 |
| EP | 2617069 A1 | 7/2013 |
| EP | 2674516 A1 | 12/2013 |
| EP | 2855744 B1 | 5/2016 |
| EP | 3053199 A1 | 8/2016 |
| EP | 3144272 A1 | 3/2017 |
| EP | 2006921 B1 | 8/2017 |
| EP | 3410002 A1 | 12/2018 |
| EP | 3410003 A1 | 12/2018 |
| EP | 2710634 B1 | 10/2020 |
| FR | 2952366 A1 | 5/2011 |
| FR | 2964796 A1 | 3/2012 |
| FR | 2969995 A1 | 7/2012 |
| FR | 2972815 A1 | 9/2012 |
| FR | 2974940 A1 | 11/2012 |
| FR | 2974941 A1 | 11/2012 |
| FR | 2975532 A1 | 11/2012 |
| FR | 2991342 A1 | 12/2013 |
| FR | 2991999 A1 | 12/2013 |
| FR | 2998090 A1 | 5/2014 |
| FR | 3011383 A1 | 4/2015 |
| FR | 3041274 A1 | 3/2017 |
| FR | 3046155 A1 | 6/2017 |
| FR | 3052915 A1 | 12/2017 |
| JP | 2016066765 A | 4/2016 |
| KR | 20140118466 A | 10/2014 |
| KR | 20170018687 A | 2/2017 |
| KR | 20180010670 A | 1/2018 |
| KR | 20180114413 A | 10/2018 |
| TW | 201417339 A | 5/2014 |
| TW | 201620163 A | 6/2016 |
| WO | 2006138465 A2 | 12/2006 |
| WO | 2011045289 A1 | 4/2011 |
| WO | 2011048318 A1 | 4/2011 |
| WO | 2012035243 A1 | 3/2012 |
| WO | 2012156620 A2 | 11/2012 |
| WO | 2013182969 A1 | 12/2013 |
| WO | 2015044620 A1 | 4/2015 |
| WO | 2016079505 A1 | 5/2016 |
| WO | 2017068029 A1 | 4/2017 |
| WO | 2017102708 A1 | 6/2017 |
| WO | 2017184686 A1 | 10/2017 |
| WO | 2017216445 A1 | 12/2017 |
| WO | 2018091657 A1 | 5/2018 |
| WO | 2018139866 A1 | 8/2018 |
| WO | 2018143682 A1 | 8/2018 |
| WO | 2018159977 A1 | 9/2018 |
| WO | 2018169243 A1 | 9/2018 |
| WO | 2019092357 A1 | 5/2019 |
| WO | 2019126539 A1 | 6/2019 |
| WO | 2020100293 A1 | 5/2020 |

(56) References Cited

FOREIGN PATENT DOCUMENTS

| | | |
|---|---|---|
| WO | 2020258027 A1 | 12/2020 |
| WO | 2021183413 A1 | 9/2021 |

\* cited by examiner

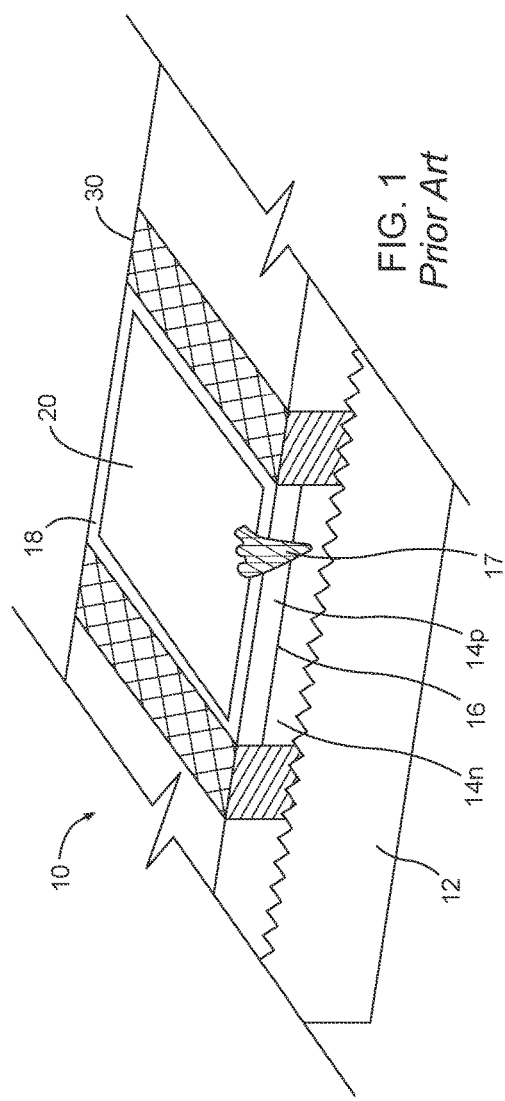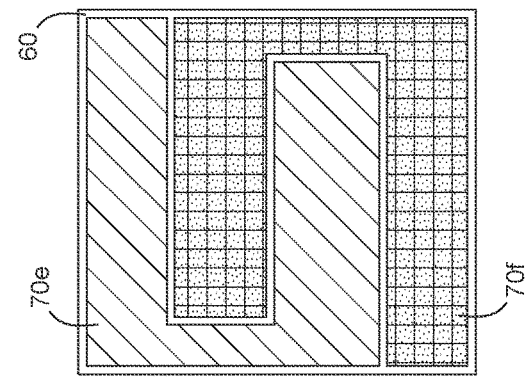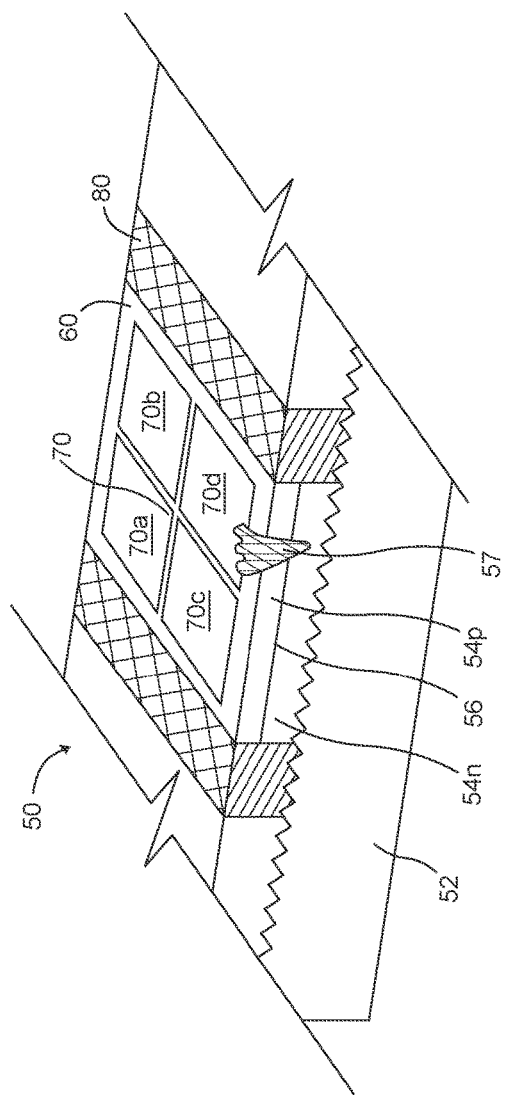

LIGHT EMITTING DIODES WITH SEGMENTED ANODES BY PIXEL

TECHNICAL FIELD

Embodiments of the disclosure generally relate to light emitting diode (LED) devices and methods of manufacturing the same. More particularly, embodiments are directed to devices comprising a plurality of pixels on a backplane, each pixel comprising an anode comprising anode segments electrically contacting respective portions of a P-type layer. Each of the anode segments is configured to localize current of each respective portion of the P-type layer during use.

BACKGROUND

A light emitting diode (LED) is a semiconductor light source that emits light when current flows through it. LEDs combine a p-type semiconductor with an n-type semiconductor. LEDs commonly use a III-V group compound semiconductor. A III-V group compound semiconductor provides stable operation at a higher temperature than devices that use other semiconductors. The III-V group compound is typically formed on a substrate formed of sapphire aluminum oxide ($Al_2O_3$), silicon (Si), or silicon carbide (SiC).

A plurality of LEDs can be arranged in various ways. The plurality of LEDs may be integral within an LED die as a monolithic array. The plurality of LEDs may be placed and attached individually or in groups to a substrate or body or transistor or backplane. Thereafter, the LED devices are incorporated into numerous types of light sources, displays, projectors, and various consumer and industrial products.

A standard procedure to manufacture an LED display or projector involves transfer and attachment of a monolithic array of LEDs or a set of singulated LED pixels to a transistor or controller backplane. In general, defects which result in non-operational or low-performance LED pixels have a random distribution on a processed LED wafer and/or on individual LED chips. Such defects may not be detected until after transfer to the backplane. Often, moreover, even though such defects have a size much smaller than an LED die or micro-LED pixel, they typically result in an entire die/pixel failure or pose long term reliability concerns.

A drawback with the monolithic arrays in view of possible defects can be low yield due to large die size, in comparison to conventional LED chips, which significantly reduces epitaxial (EPI) wafer utilization according to die yield models. On the other hand, the transfer and attachment of singulated LEDs involves some sophisticated pick-and-place processes and tools that may require to individually test and sort LED chips/pixels followed by a repair process in many cases. Also, each of these pick-and-place methods have their own limitations in terms of accuracy, cost and throughput and are only applicable to certain die/pixel architectures.

Being able to handle and assemble arrays and sets of LEDs efficiently while minimizing the impact of damaged or low-performance pixels is a continuous goal.

SUMMARY

Provided herein are light sources and methods of making them.

In an aspect, a light emitting diode (LED) device comprises: a plurality of pixels on a backplane, each pixel comprising: semiconductor layers, which include an N-type layer, an active region, and a P-type layer; a cathode electrically contacting the N-type layer; an anode comprising anode segments electrically contacting respective portions of the P-type layer; one or more dielectric materials insulating: the active region and the P-type layer from the cathode, the anode segments from each other, and the anode segments from the cathode; and a plurality of interconnects, each respective interconnect affixing a respective anode segment to the backplane.

Another aspect is a method of manufacturing a light emitting diode (LED) device, the method comprising: preparing semiconductor layers including an N-type layer, an active region, and a P-type layer; patterning the semiconductor layers to form a plurality of mesas; depositing and patterning one or more dielectric materials; depositing electrode material to form a cathode, and anode segments; depositing a plurality of interconnects onto respective anode segments; and affixing the plurality of interconnects to a backplane; wherein the one or more dielectric materials insulates: the active region and the P-type layer from the cathode, the anode segments from each other, and the anode segments from the cathode.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements. The figures herein are not to scale.

FIG. 1 shows an illustration of an exemplary local defect as part of a prior art pixel in the context of a prior art device utilizing an unsegmented anode;

FIG. 2 shows an illustration of an exemplary local defect as part of a pixel in the context of a device utilizing a segmented anode in accordance with one or more embodiments;

FIG. 3 shows an illustration of an exemplary segmented anode in accordance with one or more embodiments;

DETAILED DESCRIPTION

Figure 4:
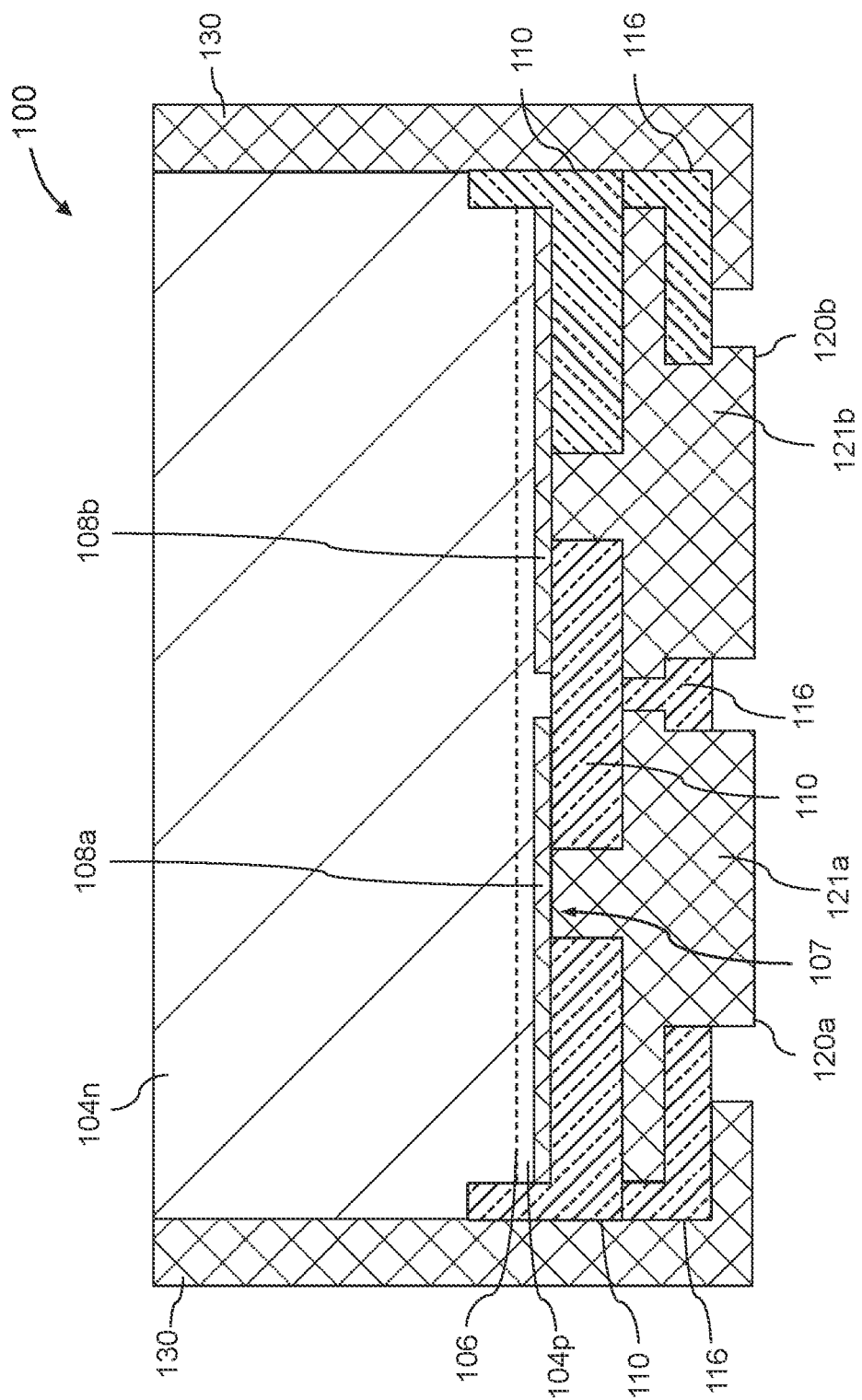
FIG. 4 is a cross-sectional view of a pixel in accordance with one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

Reference to LED refers to a light emitting diode that emits light when current flows through it. In one or more embodiments, the LEDs herein have one or more characteristic dimensions (e.g., height, width, depth, thickness, etc. dimensions) in a range of greater than or equal to 75 micrometers to less than or equal to 300 micrometers. In one or embodiments, one or more dimensions of height, width, depth, thickness have values in a range of 100 to 300 micrometers. Reference herein to micrometers allows for variation of ±1-5%. In a preferred embodiment, one or more dimensions of height, width, depth, thickness have values of 200 micrometers ±1-5%. In some instances, the LEDs are referred to as micro-LEDs (uLEDs or µLEDs), referring to a light emitting diode having one or more characteristic dimensions (e.g., height, width, depth, thickness, etc. dimensions) on the order of micrometers or tens of micrometers. In one or embodiments, one or more dimensions of height, width, depth, thickness have values in a range of 1 to less than 75 micrometers, for example from 1 to 50 micrometers, or from 1 to 25 micrometers. Overall, in one or more embodiments, the LEDs herein may have a characteristic dimension ranging from 1 micrometers to 300 micrometers, and all values and subranges therebetween.

Methods of depositing materials, layers, and thin films include but are not limited to: sputter deposition, atomic layer deposition (ALD), chemical vapor deposition (CVD), physical vapor deposition (PVD), plasma enhanced atomic layer deposition (PEALD), plasma enhanced chemical vapor deposition (PECVD), and combinations thereof.

Methods of forming or growing semiconductor layers including N-type layer, active region, and P-type layer are formed according to methods known in the art. In one or more embodiments, the semiconductor layers are formed by epitaxial (EPI) growth. The semiconductor layers according to one or more embodiments comprise epitaxial layers, III-nitride layers, or epitaxial III-nitride layers. In one or more embodiments, the semiconductor layers comprise a III-nitride material, and in specific embodiments epitaxial III-nitride material. In some embodiments, the III-nitride material comprises one or more of gallium (Ga), aluminum (Al), and indium (In). Thus, in some embodiments, the semiconductor layers comprises one or more of gallium nitride (GaN), aluminum nitride (AlN), indium nitride (InN), aluminum gallium nitride (AlGaN), indium gallium nitride (InGaN), indium aluminum nitride (InAlN), aluminum indium gallium nitride (AlInGaN) and the like. The III-nitride materials may be doped with one or more of silicon (Si), oxygen (O), boron (B), phosphorus (P), germanium (Ge), manganese (Mn), or magnesium (Mg) depending upon whether p-type or n-type III-nitride material is needed. In one or more embodiments, the semiconductor layers have a combined thickness in a range of from about 2 µm to about 10 µm, and all values and subranges therebetween.

Devices and methods herein advantageously offer ways to electrically isolate certain areas of defective pixels after backplane transfer of LEDs in order to improve yields and material utilization. The devices methods herein are suitable to be used with devices and techniques involving both monolithic arrays of LEDs and/or sets of singulated LED pixels, which are attached to a backplane. Reference to "electrically isolate" means to stop flow of current to areas of defective pixels. Devices and methods herein advantageously include LEDs with segmented anodes by pixel such that upon identification of a defect, flow of current to the areas of defective pixels can be blocked, without a need to discard an entire array or set of LED pixels or a pixel on a backplane.

As compared to standard monolithic array production processes, the devices and methods herein offer advantages. For example, higher yields for EPI wafers and reduced manufacturing costs for each LED or micro-LED array are realized by reclaiming an otherwise non-operational pixel by identifying and isolating the defective region within a pixel via a segmented anode structure. Also, lower complexity of wafer- and/or module-level electrical and optical test and inspection is expected because non-operational sub-pixels can be identified and isolated after the LED to backplane integration. Further, pixel repair processes can be eliminated, which is typically involved before or after LED to backplane integration in many cases. This can reduce the process complexity and costs and increase throughput. In addition, improved reliability of LED displays is expected in that defects localized in a small region of the affected pixel typically pose a reliability risk over long term operation, and the risk is reduced by electrically isolating these failure paths and defects.

The devices and methods herein offer similar advantages also compared LED display manufacturing where a pick-and-place of singulated LEDs is employed. For example, overall yield is increased, and number of processing steps are decreased by decreasing/eliminating the subsequent repair steps.

Features of the devices and methods herein advantageously comprise an LED/micro-LED wafer with a p-contact layer with high lateral resistance at the operating current. A segmented anode contact structure accompanies for each LED die or LED pixel where each anode segment is used to source an electrical signal to certain area(s) of each pixel. A backplane controller/transistor circuitry capable of detecting voltage or current level for each segmented anode also accompanies each LED die or LED pixel.

FIG. 1 shows an illustration of an exemplary local defect 17 as part of a prior art pixel 10 in the context of a prior art device utilizing an unsegmented anode 20. The prior art pixel 10 comprises a substrate 12 on which semiconductor layers including an N-type layer 14n, an active region 16, and a P-type layer 16p are formed. Dielectric material 18 is shown isolating the anode 20 and the cathode 30. The exemplary local defect 17 covers only a fraction of the affected pixel, but results in the failure of the entire pixel.

Devices and methods herein identify such local defects and electrically isolate them from the rest of an LED die or pixel so that the remaining area(s) of the affected unit could be electrically sourced and operated. The number of non-operational units/pixels can be greatly reduced or fully eliminated accordingly. Such an architecture is realized by segmenting the anode of LED or micro-LED pixels by employing the relatively high lateral resistance of the p-type layer in the structure. While the p-type layer of the LED pixel is not segmented, the high lateral resistance of the p-type layer confines the electrical current to areas below or in close proximity of each segmented anode at mid to high currents (which is the relevant current regime for many of the u-LED display/projector applications). This means the current distribution can be manipulated in different regions of an individual LED pixel by engineering the anode contacts to only light up select regions of the target pixel. Lateral resistance of the p-type layer can be tailored by adjusting the p-type layer growth parameters to achieve a confined current distribution at any desired operation current. In one or more embodiments, the p-type layer, e.g., pGaN, has a very high spreading resistance (MOhms). In one or more embodiments, the pixel has an InGaN structure and a pGaN p-type layer and utilizes an indium tin oxide (ITO) material as a current spreading/p-contact layer.

FIG. 2 shows an illustration of an exemplary local defect 57 as part of a pixel 50 in the context of a device utilizing a segmented anode 70, which in this embodiment collectively includes segments 70a, 70b, 70c, and 70d. The segments are individual and have distinct borders or perimeters.

The pixel 50 comprises a substrate 52 on which semiconductor layers including an N-type layer 54n, an active region 56, and a P-type layer 54p are formed. The substrate may be removed after integration with the backplane. Dielectric material 60 is shown isolating the anode 70 and the cathode 80, along with isolating each of the individual anode segments 70a, 70b, 70c, and 70d. The exemplary local defect 57 can be electrically isolated by stopping flow of current to anode segment 70d, which corresponds to the area of the defect. As such, a defect in one area of a pixel does not cause inoperability to the pixel as a whole.

This type of localized defect typically results in an entire pixel failure in pixel structures where a single anode covers the entire p-type layer. Given that the lateral resistance of the p-type layer is high enough at the operation current, the current is confined to areas right below or in close proximity of each segmented anode within each pixel. In this example, anode segments 70a, 70b, and 70c are electrically sourced by their respective controller units while no electrical power is applied to anode segment 70d. The outcome would be that the LED pixel will light up across the areas which is covered by anode segments 70a, 70b, and 70c.

While the particular example of FIG. 2 features four segmented anodes for each pixel, the pattern, size and number of segmented anodes within each pixel can be designed to reduce dead pixel counts or entirely eliminate them.

Another non-limiting example of segmentation of an anode including individual anode segments 70e and 70f separated by dielectric material 60 is shown in FIG. 3. In FIG. 3, the shape and number of segmented anodes has been designed to tailor the current distribution pattern to reach a relatively uniform luminance across a pixel with a defective section. The anode design of FIG. 3 is expected to minimize nonuniformity of luminance across a die when one anode segment is not working due to defect, as compared to a segmented anode with one anode segment on left side of die and another on right side of die.

Apart from engineering shape of the anode segments, the output light profile from each pixel can be further improved, in terms of its uniformity, in displays where a phosphor layer is applied on top of the LED pixels. This layer will result in light diffusion across the entire LED pixel and will result in a more uniform luminance scattered across the entire pixel, including the defective area. The phosphor converted LEDs are common in white LED displays and in RGB displays where different colors are produced by down-conversion.

In FIG. 4, which shows a cross-sectional view of a pixel 100 in accordance with one or more embodiments. The pixel 100 comprises semiconductor layers including an N-type layer 104n, an active region 106, and a P-type layer 104p. In this embodiment, first dielectric material 110 and second dielectric material 116 are shown providing isolation among various components. It is understood herein that one or more dielectric materials can provide the isolation needed, and the dielectric material is deposited and patterned in accordance with desired designs and applications. In some embodiments, the dielectric material comprises any suitable dielectric material, for example, silicon dioxide ($SiO_2$) or silicon oxynitride (SiON).

The pixel 100 also comprises anode segments 120a and 120b associated with respective portions of the P-type layer 104p. The anode segments 120a and 120b contact the P-type layer in a via opening 107. The anode segments 120a, 120b may be multilayered. For example, in one or more embodiments, each anode segment 120a, 120b comprises at least a p-contact layer 108a, 108b and a bonding material 121a, 121b. Consistent with being part of the anode segment 120a, 120b, the p-contact layer 108a, 108b is segmented. The p-contact layer may be effective as a current spreading layer in direct contact with the P-type layer. In one or more embodiments, the current spreading layer comprises indium tin oxide (ITO) or other suitable conducting, transparent materials, e.g., transparent conductive oxides (TCO), such as indium zinc oxide (IZO), and a thickness in a range of from 5 nm to 100 nm. The bonding material may be multilayered, in one or more embodiments, including one or more of a p-metal layer, a guard layer, a reflective material, a p-metal plug, and an under bump metallization.

Maximum optical efficiency is achieved with the minimum achievable gap between the p-contact layer and the bonding material of the anode segments, which in one or more embodiments, integrate an optical reflector.

In the embodiment of FIG. 4, the first dielectric material 110 isolates the active region 106 and the P-type layer 104p from the cathode 130. The first dielectric layer 110 and the second dielectric material 116 isolates the anode segments 120a, 120b from each other, and the anode segments 120a, 120b from cathode 130.

Figure 5:
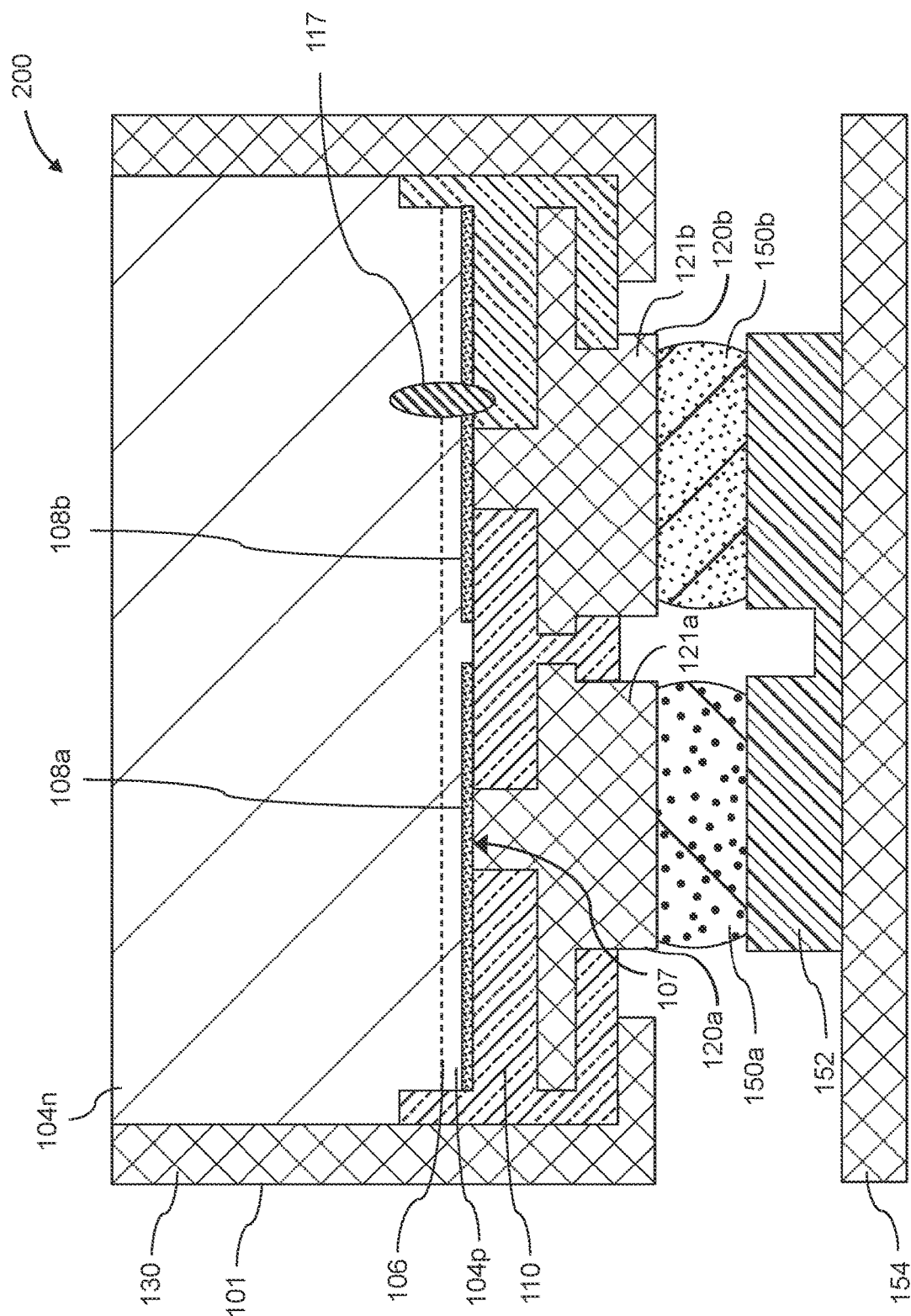
FIG. 5 is a cross-sectional view of a LED device in accordance with one or more embodiments.

FIG. 5 is a cross-sectional view of a LED device 200 in accordance with one or more embodiments. This embodiment is suitable to electrically isolate damaged portions without penalizing thermal resistance. To achieve this, electrically isolating material, e.g., thermal pads are used as interconnect bumps (150b).

The device 200 comprises a plurality of pixels, one of which is shown as pixel 101. The pixel 101, which does not include a substrate, comprises semiconductor layers including an N-type layer 104n, an active region 106, and a P-type layer 104p. In this embodiment, dielectric material 110, which has been deposited and patterned, provides isolation among various components. The dielectric material 110 isolates the active region 106 and the P-type layer 104p from cathode 130, anode segments 120a, 120b from each other, and the anode segments 120a, 120b from the cathode 130.

The pixel 101 also comprises anode segments 120a and 120b associated with respective portions of the P-type layer 104p. The anode segments 120a and 120b contact the P-type layer in a via opening 107. The anode segments 120a, 120b in this embodiment comprises a p-contact layer 108a, 108b, which is preferably a current spreading layer, and a bonding material 121a, 121b. Consistent with being part of the anode segment, the p-contact layer is segmented.

Further in FIG. 5, interconnects 150a, 150b affix respective anode segments 120a, 120b to a backplane 154 by way of a bonding layer 152.

Defect 117 is associated with a portion of the p-type layer and respective anode segment 120b. In this embodiment, physical and electrical isolation of the anode segment 120b is achieved by utilizing the interconnect 150b, which is an electrically insulating material. In one or more embodiments, the electrically insulating material comprises an electrically insulating paste.

For the rest of the p-type layer without any detected defects, and their respective anode segments including the anode segment 120a, the interconnects, including interconnect 150a, are a conducting material. In one or more embodiments, the conducting material is a metal. In one or more embodiments, the conducting material is a solder bump.

In one or more embodiments, all of the interconnects are made of conducting material, and electrical isolation is achieved by a circuit arrangement.

Figure 6:
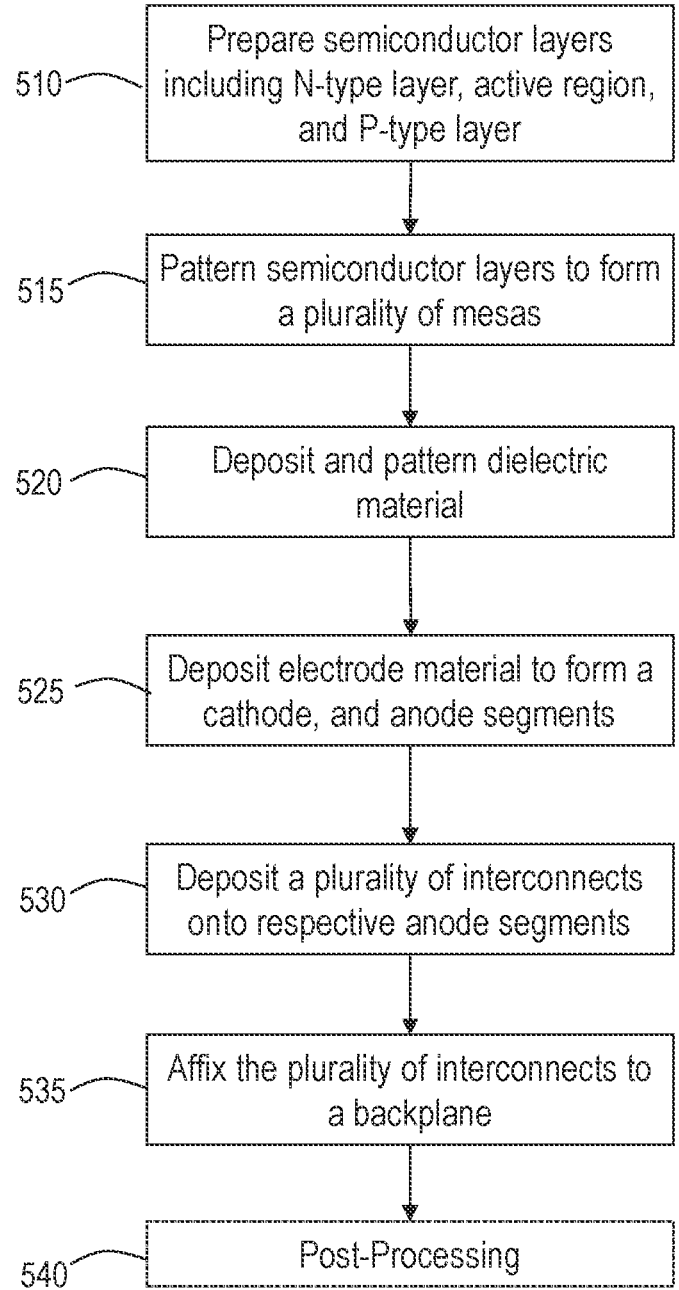
FIG. 6 provides a process flow diagram for manufacture of a light emitting diode (LED) device according to one or more embodiments.

FIG. 6 provides a process flow diagram 500 for manufacture of a light emitting diode (LED) device according to one or more embodiments. At operation 510, semiconductor layers including N-type layer, active region, and P-type layer are prepared according to methods known in the art. In one or more embodiments, the semiconductor layers are formed by epitaxial (EPI) growth. In one or more embodiments, the process starts with an LED EPI wafer, which wafer can be grown by any of the conventional growth techniques used in LED manufacturing or research and could be of different material systems including but not limited to GaN-based LEDs. In one or more embodiments, the p-type layer has a high lateral resistivity at the operating condition of the LED pixels. The lateral resistivity of such layer can be tailored by adjusting the growth condition, thickness and doping concentration in that layer. Having a high lateral resistivity in this layer is an attribute to control the current distribution across a pixel to achieve the desired function of segmented anodes.

At operation 515, after the epitaxial growth, the semiconductor layers are patterned to form a plurality of mesas. The LED mesas result from patterning the EPI wafer by conventional LED fabrication process flow, which includes etching, photolithography, metallization, lift off and oxide deposition steps.

At operation 520, dielectric material is deposited and patterned as-needed for insulating purposes. In one or more embodiments, the active region and the P-type layer are insulated from the cathode, the anode segments are insulated from each other, and the anode segments are insulated from the cathode. One or more materials and layers may be used to provide the dielectric material.

At operation 525, electrode material is deposited. The electrode material forms a cathode. The electrode material may be further patterned as-needed to yield a cathode that accommodates the LED design.

Deposition of the electrode material also yields anode segments. The segmented anode contacts can be produced by a standard metal deposition and lift off process. In contrast to a standard LED pixel with one anode contact, this electrode material is segmented into multiple smaller anodes. The electrode material may be deposited in separate doses to create anode segments that are individual and have distinct perimeters. For example, multiple metal bumps can be applied on top of the p-type layer of each individual mesa. Depending on the pixel size, each segmented anode could have one or multiple of these metal bumps. These segmented pads or bumps could be made of Ti/Au or any other metal with an ohmic contact to the p-type layer. Number of segmented anodes or anode bumps and their shape can be chosen based on the pixel size, technical limitations or statistical distribution of defects on affected pixels.

Alternatively, the electrode material may be deposited in a single dose, and then further patterned as-needed to yield anode segments that are individual and have distinct perimeters.

Or, the electrode material may be deposited by way of a stencil such as lithography lift-off process to yield anode segments that are individual and have distinct perimeters.

The structure upon completion of operation 525 is a pixel.

At operation 530, a plurality of interconnects is deposited onto respective anode segments. As discussed with respect to FIG. 5, in one or more embodiments, the interconnects can be tailored to use electrically insulating material for those anodes associated with defects, and the other interconnects are traditional conducting materials. Operation 530, therefore, may include prior to deposition of the interconnects, quality control or analytical or diagnostic testing to detect and locate any defects of the semiconductor layers (and/or pixel).

Figure 7:
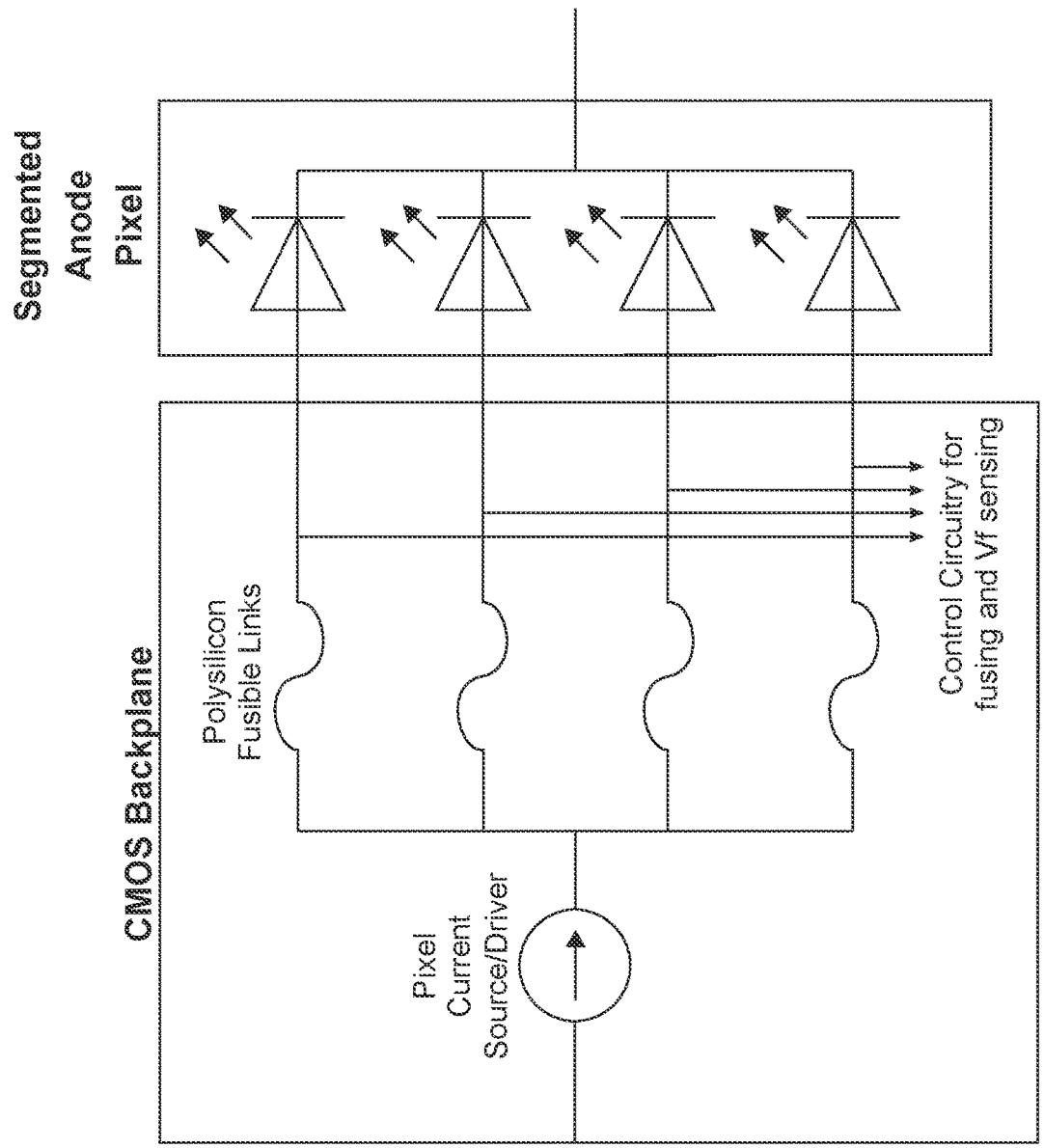
FIG. 7 provides schematic of a circuit arrangement to select anode segments for driving the LED pixel by a single current source by using fuseable links according to one or more embodiments.
Figure 8:
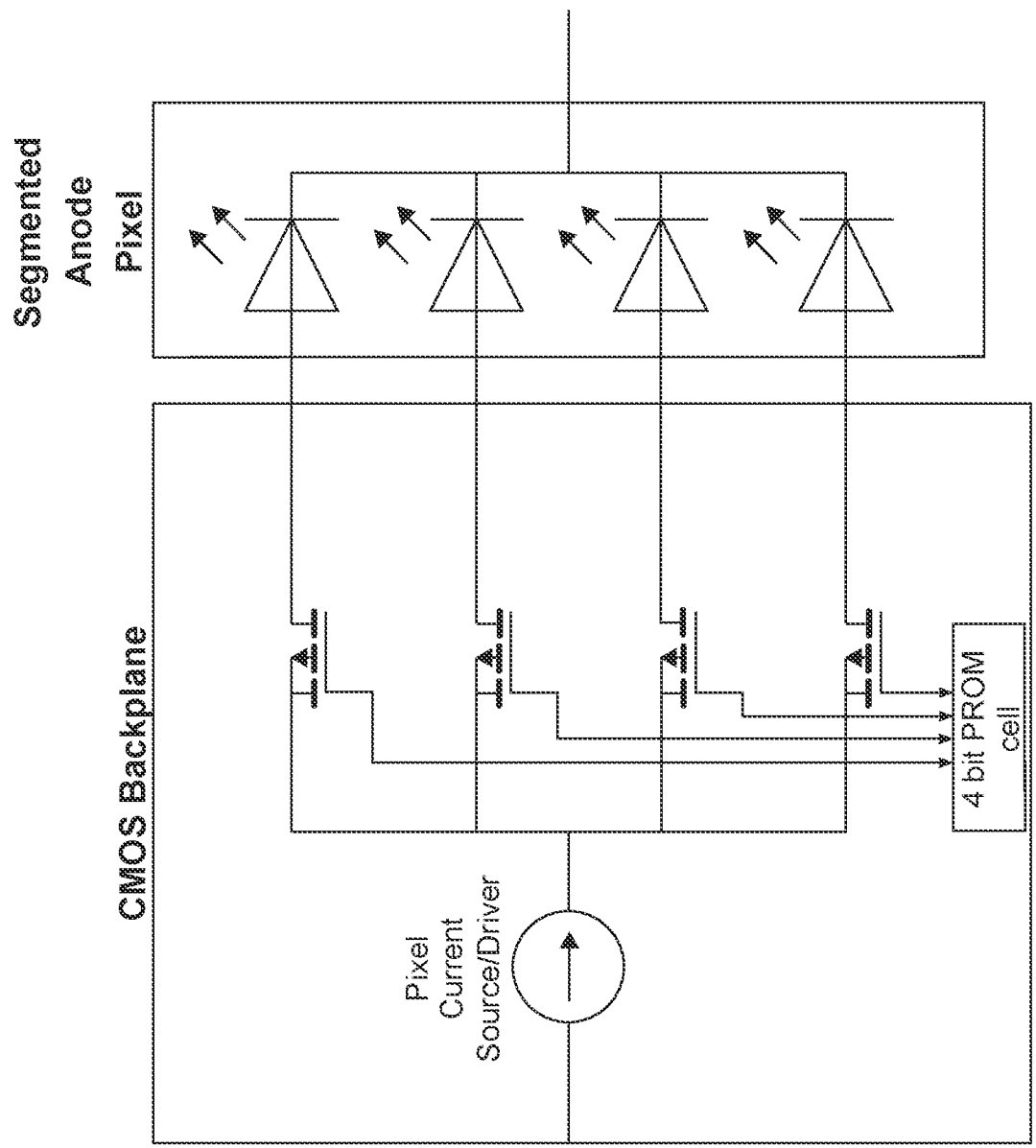
FIG. 8 provides schematic of a circuit arrangement to select anode segments for driving the LED pixel by a single current source by using P-Channel MOSFETs gated by a 4-bit PROM cell according to one or more embodiments.
Figure 9:
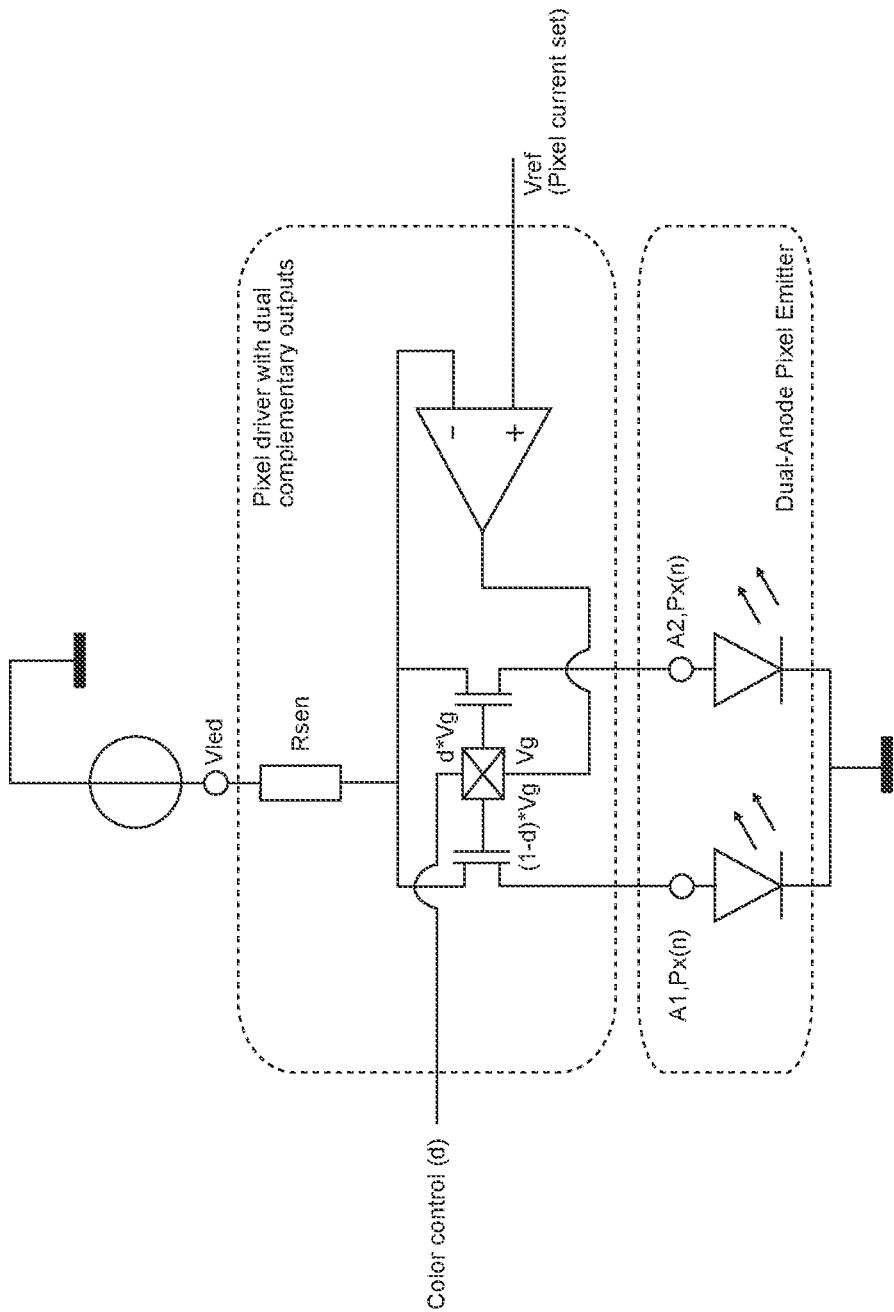
FIG. 9 provides a schematic of an integrated dual-channel current source driver with flux balancing capability according to one or more embodiments.

Alternatively, for processes that apply all interconnects as conducting materials, electrical isolation of those anode segments associated with defect is achieved by various possible circuit arrangements, examples of which are discussed with respect to FIGS. 7-9.

At operation 535, the plurality of interconnects are affixed to, or integrated with, a backplane. In one or more embodiments, a bonding layer between the interconnects and the backplane facilitates attachment.

In one or more embodiments, the LED display to back plane integration is implemented using a gold-to-gold-interconnect (GGI) process. In this architecture, each anode segment is integrated to a separate transistor or controller from the back plane and therefore can be individually controlled and verified during operation.

Many of back plane controllers have a capability to measure and monitor the electrical power sourced by each transistor or controller unit and can detect open or short circuits. This means certain areas of a pixel which contains a defect could be electrically isolated from the rest of pixel by not sourcing the segmented anode which has the defective area underneath or in its close proximity. The remaining area of the effected pixel can be electrically sourced as they are controlled by different controller/transistor units.

One other possible embodiment would use one transistor/controller unit per pixel but will only electrically connect the non-defective areas of each pixel to controller. Good-known-subpixels could be identified and sorted using a contactless wafer- or tape-level characterization technique (e.g., contact-less photoluminescence and/or contact-less electroluminescence) to generate a traceability map of known-good-subpixels. Then, this traceability map could be used to perform a selective attachment of good subpixels (e.g., by putting conductive bumps only on the good-subpixels) to a single transistor/controller unit which controls the entire pixel.

At operation 540, optional further post-processing is performed. In one or more embodiments, further processing including formation of a passivation layer around a portion or the entirety of a LED or a uLED or the device as a whole. In one or more embodiments, the processed structure retains a substrate, is singulated, and is further processed. In one or more embodiments, the processed structure is flipped and affixed to a support, for example, a tape support, and the substrate is removed. Removal of the substrate is in accordance with methods known in the art including substrate laser liftoff. Upon removal of the substrate, singulated LEDs or uLEDs are created.

Further processing can include deposition of a downconverter material, e.g. layers of a phosphor material.

In some embodiments, LED devices herein are further processed to include optical elements such as lenses, metalenses, and/or pre-collimators. Optical elements can also or alternatively include apertures, filters, a Fresnel lens, a convex lens, a concave lens, or any other suitable optical element that affects the projected light from the light emitting array. Additionally, one or more of the optical elements can have one or more coatings, including UV blocking or anti-reflective coatings. In some embodiments, optics can be used to correct or minimize two- or three dimensional optical errors including pincushion distortion, barrel distortion, longitudinal chromatic aberration, spherical aberration, chromatic aberration, field curvature, astigmatism, or any other type of optical error. In some embodiments, optical elements can be used to magnify and/or correct images. Advantageously, in some embodiments magnification of display images allows the light emitting array to be physically smaller, of less weight, and require less power than larger displays. Additionally, magnification can increase a field of view of the displayed content allowing display presentation equals a user's normal field of view.

In one or more embodiments, quality control or analytical or diagnostic testing is conducted during any appropriate operation of the manufacturing method to detect and locate any defects of the semiconductor layers (and/or pixel). Defects may be detected by a controller unit to a backplane holding the pixel due to an electrical signal that is out-of-specification.

For processes that apply all interconnects as conducting materials, electrical isolation of those anode segments associated with defect is achieved by various possible circuit arrangements. Upon detection of a defect, the respective control unit will not source any current to the anode segment associated with the defect. There are a number of potential architectures to arrange the controller architecture to deselect the defective LED pixel segment.

FIG. 7 shows a circuit arrangement to select anode segments for driving the LED pixel by a single current source by using polysilicon fuseable links. Once an anode segment has been defined for exclusion of a driver current, the fusible link can be blown using dedicated circuitry at the end of the assembly line. An advantage of this method is the simple implementation in above-silicon mask layers. This method has a potential to introduce some additional resistance.

FIG. 8 shows a circuit arrangement to select anode segments for driving the LED pixel by a single current source by using P-Channel MOSFETs gated by a 4-bit PROM cell. The gate of each channel is driven by a one-time-programmable memory cell, that can be programmed again at the end of the assembly line. An advantage of this method is the low resistance and standard circuitry. This method has a potential to limit a minimum pixel size as the P-channel MOSFETS require a certain structure space in the diffusion layers of the silicon.

FIG. 9 shows a circuit arrangement including integrated dual-channel current source driver with flux balancing capability. From a system control viewpoint, the clustering of multi-anode pixels as shown in FIGS. 4 and 5 may be regarded as a single pixel driven by a common drive current and a control signal to balance the brightness of each anode regardless of the set drive current. This can simplify complexity of the driver and/or reduce component count and/or increase driver efficiency. FIG. 9 shows a possible realization of such cluster driver featuring a complementary dual current output for the intensity control of each anode. Essentially, a small signal analog multiplier is employed to balance out the set drive current through each segmented active region such that $I(led.color1)=d*Idrv$ and $I(led.color2)=(1-d)*Idrv$, where Idrv is the set drive current of the current source and d may vary between 0 and 1.

Display Devices

Some display devices comprise single or singulated LEDs or pixels, which include the segmented anodes disclosed herein.

Other display devices comprise arrays and groups of LEDs or pixels, which include the segmented anodes disclosed herein.

Figure 10:
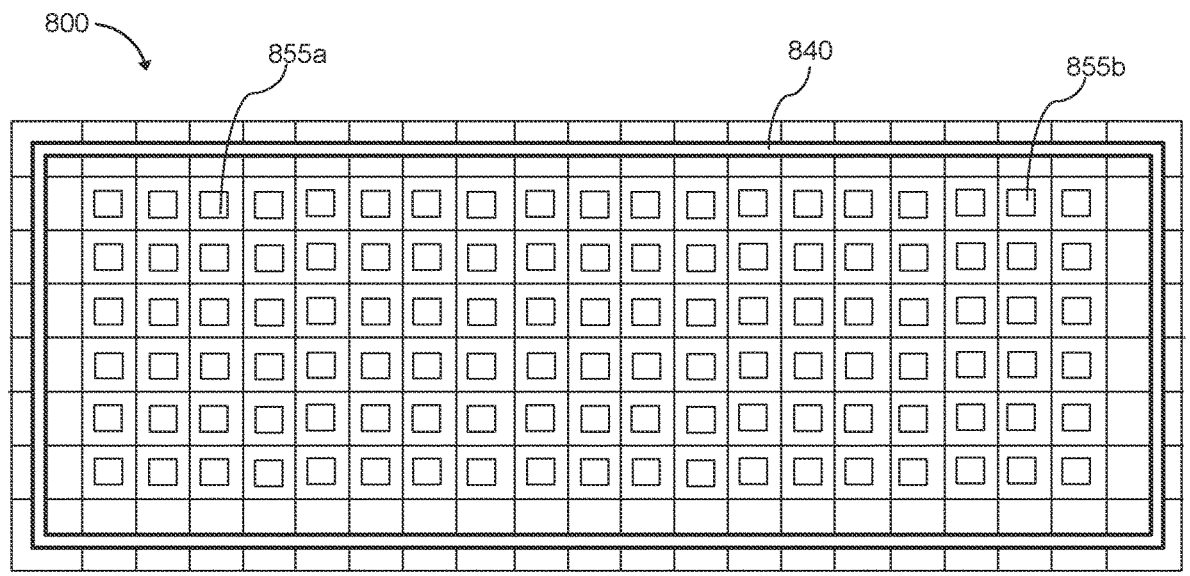
FIG. 10 illustrates a top view of an exemplary display device according to one or more embodiments.

FIG. 10 shows a top plan view of an LED monolithic array 800 comprising a plurality of pixels arranged in a grid of 6×19. Pixels 855a and 855b are examples. In this embodiment, a common cathode 840 is connected to the pixels. Anodes, not shown, present on the underside are included with each pixel. In one or more embodiments, the array comprises an arrangement of 2×2 mesas, 4×4 mesas, 20×20 mesas, 50×50 mesas, 100×100 mesas, or n1×n2 mesas, where each of n1 and n2 is a number in a range of from 2 to 1000, and n1 and n2 can be equal or not equal.

In one or more embodiments, arrays of micro-LEDs (μLEDs or uLEDs) are used. Micro-LEDs can support high density pixels having a lateral dimension less than 100 μm by 100 μm. In some embodiments, micro-LEDs with dimensions of about 50 μm in diameter or width and smaller can be used. Such micro-LEDs can be used for the manufacture of color displays by aligning in close proximity micro-LEDs comprising red, blue and green wavelengths.

In some embodiments, the light emitting arrays include small numbers of micro-LEDs positioned on substrates that are centimeter scale area or greater. In some embodiments, the light emitting arrays include micro-LED pixel arrays with hundreds, thousands, or millions of light emitting LEDs positioned together on centimeter scale area substrates or smaller. In some embodiments, micro-LEDs can include light emitting diodes sized between 30 microns and 500 microns. The light emitting array(s) can be monochromatic, RGB, or other desired chromaticity. In some embodiments, pixels can be square, rectangular, hexagonal, or have curved perimeter. Pixels can be of the same size, of differing sizes, or similarly sized and grouped to present larger effective pixel size.

In some embodiments, light emitting pixels and circuitry supporting light emitting arrays are packaged and optionally include a submount or printed circuit board connected for powering and controlling light production by semiconductor LEDs. In certain embodiments, a printed circuit board supporting light emitting array includes electrical vias, heat sinks, ground planes, electrical traces, and flip chip or other mounting systems. The submount or printed circuit board may be formed of any suitable material, such as ceramic, silicon, aluminum, etc. If the submount material is conductive, an insulating layer is formed over the substrate material, and the metal electrode pattern is formed over the insulating layer. The submount can act as a mechanical support, providing an electrical interface between electrodes on the light emitting array and a power supply, and also provide heat sink functionality.

In some embodiments, LED light emitting arrays include optical elements such as lenses, metalenses, and/or pre-collimators. Optical elements can also or alternatively include apertures, filters, a Fresnel lens, a convex lens, a concave lens, or any other suitable optical element that affects the projected light from the light emitting array. Additionally, one or more of the optical elements can have one or more coatings, including UV blocking or anti-reflective coatings. In some embodiments, optics can be used to correct or minimize two- or three dimensional optical errors including pincushion distortion, barrel distortion, longitudinal chromatic aberration, spherical aberration, chromatic aberration, field curvature, astigmatism, or any other type of optical error. In some embodiments, optical elements can be used to magnify and/or correct images. Advantageously, in some embodiments magnification of display images allows the light emitting array to be physically smaller, of less weight, and require less power than larger displays. Additionally, magnification can increase a field of view of the displayed content allowing display presentation equals a user's normal field of view.

Applications

Figure 11:
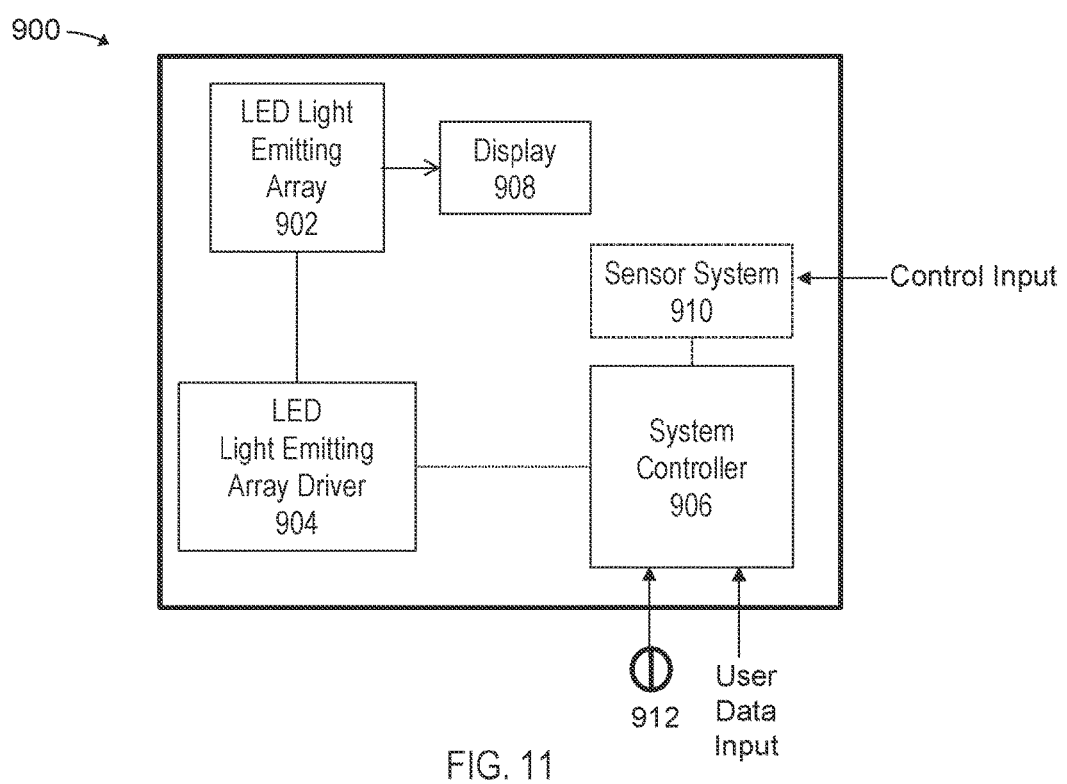
FIG. 11 schematically illustrates an exemplary display system comprising LED devices according to embodiments herein.

FIG. 11 schematically illustrates an exemplary display system 900 utilizing LEDs disclosed herein. The display system 900 comprises an LED light emitting array 902 and display 908 in electrical communication with an LED driver 904. The display system 900 also comprises a system controller 906, such as a microprocessor. The controller 906 is coupled to the LED driver 904. The controller 906 may also be coupled to the display 908 and to optional sensor(s) 910, and be powered by power source 912. In one or more embodiments, user data input is provided to system controller 906.

In one or more embodiments, the system is a camera flash system utilizing uLEDs. In such an embodiment, the LED light emitting array 902 is an illumination array and lens system and the display 908 comprises a camera, wherein the LEDs of 902 and the camera of 908 may be controlled by the controller 906 to match their fields of view.

Optionally sensors 910 with control input may include, for example, positional sensors (e.g., a gyroscope and/or accelerometer) and/or other sensors that may be used to determine the position, speed, and orientation of system. The signals from the sensors 910 may be supplied to the controller 906 to be used to determine the appropriate course of action of the controller 906 (e.g., which LEDs are currently illuminating a target and which LEDs will be illuminating the target a predetermined amount of time later).

In operation, illumination from some or all of the pixels of the LED array in 902 may be adjusted—deactivated, operated at full intensity, or operated at an intermediate intensity. As noted above, beam focus or steering of light emitted by the LED array in 902 can be performed electronically by activating one or more subsets of the pixels, to permit dynamic adjustment of the beam shape without moving optics or changing the focus of the lens in the lighting apparatus.

LED array systems such as described herein may support various other beam steering or other applications that benefit from fine-grained intensity, spatial, and temporal control of light distribution. These applications may include, but are not limited to, precise spatial patterning of emitted light from pixel blocks or individual pixels. Depending on the application, emitted light may be spectrally distinct, adaptive over time, and/or environmentally responsive. The light emitting pixel arrays may provide pre-programmed light distribution in various intensity, spatial, or temporal patterns. Associated optics may be distinct at a pixel, pixel block, or device level. An example light emitting pixel array may include a device having a commonly controlled central block of high intensity pixels with an associated common optic, whereas edge pixels may have individual optics. In addition to flashlights, common applications supported by light emitting pixel arrays include video lighting, automotive headlights, architectural and area illumination, and street lighting.

Other applications of LED devices herein include an augmented reality/virtual reality (AR/VR) systems, which may utilize uLEDs disclosed herein. One or more AR/VR systems include: augmented (AR) or virtual reality (VR) headsets, glasses, or projectors. Such AR/VR systems includes an LED light emitting array, an LED driver (or light emitting array controller), a system controller, an AR or VR display, a sensor system 810. Control input may be provided to the sensor system, while power and user data input is provided to the system controller. As will be understood, in some embodiments modules included in the AR/VR system can be compactly arranged in a single structure, or one or more elements can be separately mounted and connected via wireless or wired communication. For example, the light emitting array, AR or VR display, and sensor system can be mounted on a headset or glasses, with the LED driver and/or system controller separately mounted.

In one embodiment, the light emitting array can be used to project light in graphical or object patterns that can support AR/VR systems. In some embodiments, separate light emitting arrays can be used to provide display images, with AR features being provided by a distinct and separate micro-LED array. In some embodiments, a selected group of pixels can be used for displaying content to the user while tracking pixels can be used for providing tracking light used in eye tracking. Content display pixels are designed to emit visible light, with at least some portion of the visible band (approximately 400 nm to 750 nm). In contrast, tracking pixels can emit light in visible band or in the IR band (approximately 750 nm to 2,200 nm), or some combination thereof. As an alternative example, the tracking pixels could operate in the 800 to 1000 nanometer range. In some embodiments, the tracking pixels can emit tracking light during a time period that content pixels are turned off and are not displaying content to the user.

The AR/VR system can incorporate a wide range of optics in the LED light emitting array and/or AR/VR display, for example to couple light emitted by the LED light emitting array into AR/VR display as discussed above. For AR/VR applications, these optics may comprise nanofins and be designed to polarize the light they transmit.

In one embodiment, the light emitting array controller can be used to provide power and real time control for the light emitting array. For example, the light emitting array controller can be able to implement pixel or group pixel level control of amplitude and duty cycle. In some embodiments, the light emitting array controller further includes a frame buffer for holding generated or processed images that can be supplied to the light emitting array. Other supported modules can include digital control interfaces such as Inter-Integrated Circuit (I2C) serial bus, Serial Peripheral Interface (SPI), USB-C, HDMI, Display Port, or other suitable image or control modules that are configured to transmit needed image data, control data or instructions.

In operation, pixels in the images can be used to define response of corresponding light emitting array, with intensity and spatial modulation of LED pixels being based on the image(s). To reduce data rate issues, groups of pixels (e.g. 5×5 blocks) can be controlled as single blocks in some embodiments. In some embodiments, high speed and high data rate operation is supported, with pixel values from successive images able to be loaded as successive frames in an image sequence at a rate between 30 Hz and 100 Hz, with 60 Hz being typical. Pulse width modulation can be used to control each pixel to emit light in a pattern and with an intensity at least partially dependent on the image.

In some embodiments, the sensor system can include external sensors such as cameras, depth sensors, or audio sensors that monitor the environment, and internal sensors such as accelerometers or two or three axis gyroscopes that monitor AR/VR headset position. Other sensors can include but are not limited to air pressure, stress sensors, temperature sensors, or any other suitable sensors needed for local or remote environmental monitoring. In some embodiments, control input can include detected touch or taps, gestural input, or control based on headset or display position. As another example, based on the one or more measurement signals from one or more gyroscope or position sensors that measure translation or rotational movement, an estimated position of AR/VR system relative to an initial position can be determined.

In some embodiments, the system controller uses data from the sensor system to integrate measurement signals received from the accelerometers over time to estimate a velocity vector and integrate the velocity vector over time to determine an estimated position of a reference point for the AR/VR system. In other embodiments, the reference point used to describe the position of the AR/VR system can be based on depth sensor, camera positioning views, or optical field flow.

Based on changes in position, orientation, or movement of the AR/VR system, the system controller can send images or instructions the light emitting array controller. Changes or modification in the images or instructions can also be made by user data input, or automated data input as needed. User data input can include but is not limited to that provided by audio instructions, haptic feedback, eye or pupil positioning, or connected keyboard, mouse, or game controller.

Embodiments

Various embodiments are listed below. It will be understood that the embodiments listed below may be combined with all aspects and other embodiments in accordance with the scope of the invention.

Embodiment (a) A light emitting diode (LED) device comprising: a plurality of pixels on a backplane, each pixel comprising: semiconductor layers, which include an N-type layer, an active region, and a P-type layer; a cathode electrically contacting the N-type layer; an anode comprising anode segments electrically contacting respective portions of the P-type layer; one or more dielectric materials insulating: the active region and the P-type layer from the cathode, the anode segments from each other, and the anode segments from the cathode; and a plurality of interconnects, each respective interconnect affixing a respective anode segment to the backplane.

Embodiment (b) The LED device of embodiment (a), wherein each of the anode segments is configured to localize current within each of the respective portions of the P-type layer during use.

Embodiment (c) The LED device of any of embodiments (a) to (b), wherein each of the anode segments comprises: a P-contact layer and a bonding material.

Embodiment (d) The LED device of any of embodiments (a) to (c), wherein upon detection of a defect in a pixel, the defect being associated with a respective defect anode segment, the interconnect for the respective defect anode segment comprises an electrically insulating material.

Embodiment (e) The LED device of any of embodiments (a) to (d), wherein in the absence of detection of a defect in a pixel for a respective anode segment, the interconnect for the respective anode segment comprises a conducting material.

Embodiment (f) The LED device of any of embodiments (a) to (e) further comprising a circuit arrangement configured to individually control each anode segment.

Embodiment (g) The LED device of any of embodiments (a) to (f), wherein the plurality of interconnects comprises a conducting material, and upon detection of a defect in a pixel, the defect being associated with a respective defect anode segment, the circuit arrangement provides an electrical isolation of the respective defect anode segment.

Embodiment (h) The LED device of embodiment (g), wherein the electrical isolation comprises a blown fusible link to the respective defect anode segment.

Embodiment (i) The LED device of embodiment (g), wherein the electrical isolation comprises a closed gate to the respective defect anode segment.

Embodiment (j) The LED device of any of embodiments (a) to (i), wherein each pixel is a micro-light emitting diode (uLED) having at least one characteristic dimension of less than 100 micrometers, the characteristic dimension being selected from the group consisting of: height, width, depth, thickness, and combinations thereof.

Embodiment (k) A method of manufacturing a light emitting diode (LED) device, the method comprising: preparing semiconductor layers including an N-type layer, an active region, and a P-type layer; patterning the semiconductor layers to form a plurality of mesas; depositing and patterning one or more dielectric materials; depositing electrode material to form a cathode, and anode segments; depositing a plurality of interconnects onto respective anode segments; affixing the plurality of interconnects to a backplane; and wherein the one or more dielectric materials insulates: the active region and the P-type layer from the cathode, the anode segments from each other, and the anode segments from the cathode.

Embodiment (l) The method of embodiment (k), wherein each of the anode segments is configured to localize current within each of the respective portions of the P-type layer during use.

Embodiment (m) The method of any of embodiments (k) to (1), wherein each of the anode segments comprises: a P-contact layer and a bonding material.

Embodiment (n) The method of any of embodiments (k) to (m) further comprising detecting one or more defects in the pixels, each defect being associated with a respective defect anode segment, and utilizing an electrically insulating material as the interconnect for the respective defect anode segment.

Embodiment (o) The method of any of embodiments (k) to (n), wherein in the absence of detecting a defect in a pixel for a respective anode segment, utilizing a conducting material as the interconnect for the respective anode segment.

Embodiment (p) The method of any of embodiments (k) to (o) further comprising configuring a circuit arrangement of the backplane to individually control each anode segment.

Embodiment (q) The method of embodiment (p) further comprising utilizing a metal material as the interconnects, detecting one or more defects in the pixels being associated with a respective defect anode segment, and electrically isolating each respective defect anode segment.

Embodiment (r) The method of embodiment (q), wherein the electrically isolating comprises blowing a fusible link to the respective defect anode segment.

Embodiment (s) The method of embodiment (q), wherein the electrically isolating comprises closing a gate to the respective defect anode segment.

Embodiment (t) The method of any of embodiments (k) to (s), wherein each pixel has at least one characteristic dimension of less than 100 micrometers, the characteristic dimension being selected from the group consisting of: height, width, depth, thickness, and combinations thereof.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

What is claimed is:

1. A light emitting diode (LED) device comprising:
  a plurality of pixels on a backplane, each pixel comprising:
  semiconductor layers, which include an N-type layer, an active region, and a P-type layer;
  a cathode electrically contacting the N-type layer;
  an anode comprising anode segments electrically contacting respective portions of the P-type layer;
  one or more dielectric materials insulating: the active region and the P-type layer from the cathode, the anode segments from each other, and the anode segments from the cathode; and
  a plurality of interconnects, each respective interconnect affixing a respective anode segment to the backplane.

2. The LED device of claim 1, wherein each of the anode segments is configured to localize current-within the respective portion of the P-type layer during use.

3. The LED device of claim 1, wherein each of the anode segments comprises: a P-contact layer and a bonding material.

4. The LED device of claim 1, wherein upon detection of a defect in a pixel, the defect being associated with a respective defect anode segment, the interconnect for the respective defect anode segment comprises an electrically insulating material.

5. The LED device of claim 1, wherein in the absence of detection of a defect in a pixel for a respective anode segment, the interconnect for the respective anode segment comprises a conducting material.

6. The LED device of claim 1 further comprising a circuit arrangement configured to individually control each anode segment.

7. The LED device of claim 6, wherein the plurality of interconnects comprises a conducting material, and upon detection of a defect in a pixel, the defect being associated with a respective defect anode segment, the circuit arrangement provides an electrical isolation of the respective defect anode segment.

8. The LED device of claim 7, wherein the electrical isolation comprises a blown fusible link to the respective defect anode segment.

9. The LED device of claim 7, wherein the electrical isolation comprises a closed gate to the respective defect anode segment.

10. The LED device of claim 1, wherein each pixel is a micro-light emitting diode (uLED) having at least one characteristic dimension of less than 100 micrometers, the character dimension being selected from the group consisting of: height, width, depth, thickness, and combinations thereof.

11. A method of manufacturing light emitting diode (LED) device of claim 1, the method comprising:
  preparing the semiconductor layers including the N-type layer, the active region, and the P-type layer;
  patterning the semiconductor layers to form a plurality of mesas;
  depositing and patterning the one or more dielectric materials;
  depositing electrode material to form the cathode, and the anode segments;
  depositing the plurality of interconnects onto respective anode segments;
  affixing the plurality of interconnects to the backplane,
  wherein the one or more dielectric materials insulates: the active region and the P-type layer from the cathode, the anode segments from each other, and the anode segments from the cathode.

12. The method of claim 11, wherein each of the anode segments is configured to localize current of within the respective portion of the P-type layer during use.

13. The method of claim 11, wherein each of the anode segments comprises: a P-contact layer and a bonding material.

14. The method of claim 11 further comprising detecting one or more defects in the pixels, each defect being associated with a respective defect anode segment, and utilizing an electrically insulating material as the interconnect for the respective defect anode segment.

15. The method of claim 11, wherein in the absence of detecting a defect in a pixel for a respective anode segment, utilizing a conducting material as the interconnect for the respective anode segment.

16. The method of claim 11 further comprising configuring a circuit arrangement of the backplane to individually control each anode segment.

17. The method of claim 16 further comprising utilizing a metal material as the interconnects, detecting one or more defects in the pixels being associated with a respective defect anode segment, and electrically isolating each respective defect anode segment.

18. The method of claim 17, wherein the electrically isolating comprises blowing a fusible link to the respective defect anode segment.

19. The method of claim 17, wherein the electrically isolating comprises closing a gate to the respective defect anode segment.

20. The method of claim 11, wherein each pixel has at least one characteristic dimension of less than 100 micrometers, the character dimension being selected from the group consisting of: height, width, depth, thickness, and combinations thereof.

* * * * *